United States Patent
Orlowski

(10) Patent No.: US 7,535,060 B2
(45) Date of Patent: May 19, 2009

(54) CHARGE STORAGE STRUCTURE FORMATION IN TRANSISTOR WITH VERTICAL CHANNEL REGION

(75) Inventor: Marius K. Orlowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/370,283

(22) Filed: Mar. 8, 2006

(65) Prior Publication Data

US 2007/0210338 A1 Sep. 13, 2007

(51) Int. Cl.
*H01L 29/792* (2006.01)
(52) U.S. Cl. .................. 257/347; 257/315; 257/324; 257/350; 257/619; 257/625; 257/E27.112
(58) Field of Classification Search ............ 257/315, 257/324, 347, 350, 619, 625, E27.112
See application file for complete search history.

(56) References Cited

U.S. PATENT DOCUMENTS

| | | | |
|---|---|---|---|
| 5,325,327 A | 6/1994 | Ema | |
| 6,011,725 A | 1/2000 | Eltan | |
| 6,330,184 B1 | 12/2001 | White et al. | |
| 6,492,228 B2 | 12/2002 | Gonzalez et al. | |
| 6,706,599 B1 | 3/2004 | Sadd et al. | |
| 6,849,487 B2 | 2/2005 | Taylor, Jr. et al. | |
| 6,903,967 B2 * | 6/2005 | Mathew et al. ............. | 365/177 |
| 7,371,638 B2 * | 5/2008 | Cho et al. ................. | 438/257 |
| 2001/0019150 A1 | 9/2001 | Kawai et al. | |
| 2001/0053569 A1 | 12/2001 | Skotnicki et al. | |
| 2003/0178670 A1 | 9/2003 | Fried et al. | |
| 2004/0235300 A1 | 11/2004 | Mathew et al. | |
| 2005/0068806 A1 | 3/2005 | Hurst et al. | |
| 2005/0145926 A1 * | 7/2005 | Lee ........................... | 257/316 |
| 2005/0189579 A1 | 9/2005 | Adachi et al. | |

OTHER PUBLICATIONS

Hideo Sunami, Thermal Oxidation of Phosphorus-Doped Polycrystalline Silicon in Wet Oxygen, Journal of Electrochemical Society, Jun. 1978, pp. 892-897.

S. Wilson, Properties of Ion-Implanted Polycrystalline Si Layers Subjected to Rapid Thermal Annealing, Journal of Electrochemical Society, Apr. 1985, pp. 922-929.

T. I. Kamins, Design Properties of Polycrystalline Silicon, Sensors and Actuators, A21-A23 1990, pp. 817-824.

(Continued)

*Primary Examiner*—Eduardo A Rodela
(74) *Attorney, Agent, or Firm*—John A Fortkort; Fortkort & Houston P.C.

(57) ABSTRACT

A semiconductor device includes a semiconductor structure having a first sidewall. A vertical channel region is formed in the semiconductor structure along the first sidewall between a first current electrode region and a second current electrode region. First and second charge storage structures are formed adjacent to the first sidewall in openings of a dielectric layer. The first and second charge storage structures are electrically isolated from each other and from the semiconductor structure. A control electrode is formed adjacent to the first sidewall. In another embodiment, third and fourth charge storage structures may be formed adjacent to a second sidewall of the semiconductor structure in openings of a dielectric layer.

24 Claims, 6 Drawing Sheets

OTHER PUBLICATIONS

Andrea E. Franke, et al., Polycrystalline Silicon-Germanium Films for Integrated Microsystems, Journal of Microelectromechanical Systesms, vol. 12, No. 2, Apr. 2003.

Daniel L. Flamm, Mechanisms of silicon etching in fluorine- and chlorine-containing plasmas, Pure & Appl. Chem., vol. 62, No. 9, pp. 1709-1720, 1990.

M Specht, et al., Sub-40nm tri-gate charge trapping nonvolatile memory cells for high-density applications, 2004 Symposium on VLSI Technology Digest of Technical Papers.

Marius K. Orlowski, Method for Making a Multibit Transistor, filed with the USPTO on Mar. 8, 2006.

International Search Report and Written Opinion for correlating PCT Patent Application No. PCT/US07/62634 dated Apr. 16, 2008.

* cited by examiner

CHARGE STORAGE STRUCTURE FORMATION IN TRANSISTOR WITH VERTICAL CHANNEL REGION

BACKGROUND OF THE INVENTION

1. Field of the Invention

This invention relates in general to semiconductor devices and specifically to non volatile memory devices.

2. Description of the Related Art

Non volatile memory devices utilize charge storage structures for selectively storing charge indicative of a bit of information to be stored. Such charge storage structures may include nitride, silicon nanocrystals, semiconductor material, or conductive material e.g. metals.

Some memories utilize multi-bit (multiple bit) memory cells. A multi-bit memory cell is a cell that can store more than one bit of information. Some multi-bit cells include a charge storage structure that has multiple charge storage locations or regions in the charge storage structure. Charge is selectively added to each region to selectively store a bit in the cell.

One problem with some multi-bit cells with a charge storage structure having multiple charge storage locations is that the charge may migrate between the charge storage locations, especially with a higher conductivity of some charge storage structure material.

What is desirable is a multi-bit memory cell configuration having separate charge storage structures.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The features shown in the Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
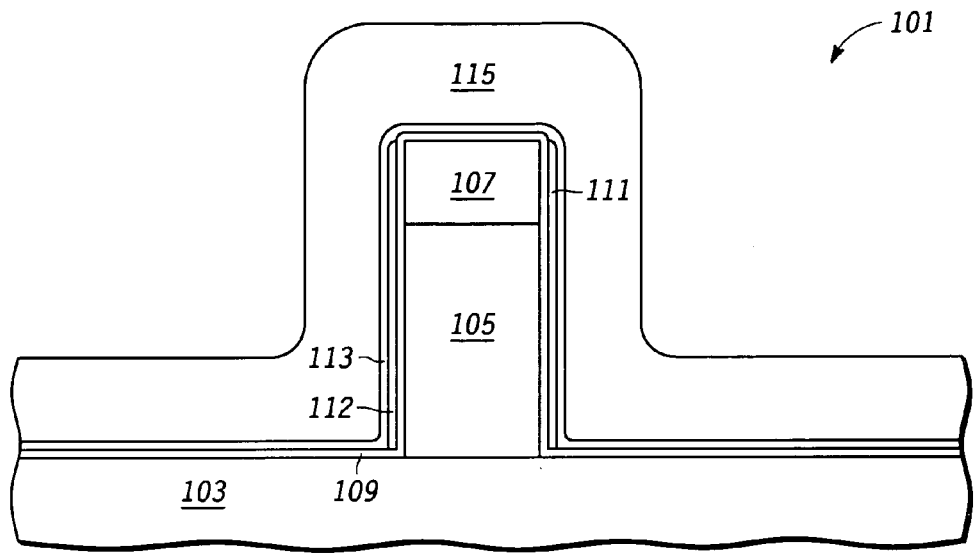
FIG. 1 is a partial cross sectional side view of a wafer during a stage in its manufacture according to one embodiment of the present invention.

FIG. 1 is a partial side cross sectional side view of a wafer utilized to form a multi-bit memory cell according to one embodiment of the present invention. Wafer 101 includes an insulating layer 103. In one embodiment, layer 103 is located over a semiconductor substrate (not shown). A semiconductor fin structure 105 and cap 107 are formed by pattering a semiconductor layer (not shown) and dielectric layer (e.g. oxide, silicon nitride) (not shown) over the semiconductor layer. In one embodiment, fin structure 105 is monocrystalline silicon but may be of other semiconductor materials (e.g. silicon germanium) in other embodiments. Also, cap 107 may be of other materials in other embodiments.

After the patterning to form fin structure 105 and cap 107, a dielectric layer 109 is deposited over wafer 101. In one embodiment, layer 109 is made of silicon dioxide and is deposited by a chemical vapor deposition process. However, in other embodiments, layer 109 may be of other materials (e.g. a metal oxide or nitride) and/or may be formed by other processes. In one embodiment, layer 109 may be formed by oxidizing fin structure 105. In one embodiment, layer 109 has a thickness of 10-100 angstroms.

Following the formation of layer 109, dielectric structures 111 and 112 are formed. In the embodiment shown, dielectric structures 111 and 112 are formed by forming a second dielectric layer over layer 109 and then subsequently anisotropically etching the layer to remove the portions of that layer on the horizontal surfaces of wafer 101. However, in other embodiments, this second dielectric layer would not be etched at this point to remove the material on the horizontal surfaces. The material of dielectric structures 111 and 112 is etch selective with respect to the material of dielectric layer 109. In one embodiment, structures 111 and 112 are made of nitride but may be made of other materials in other embodiments (e.g. silicon oxide). In one embodiment, the second dielectric layer (the layer of structures 111, 112) has a thickness in the range of 20-70 angstroms but may be of other thicknesses in other embodiments.

After the formation of structures 111 and 112, a third dielectric layer 113 is formed over wafer 101. Layer 113 is etch selective with the material of structures 111 and 112. In one embodiment, layer 113 and/or layer 109 is made of silicon oxide, but may be made of other materials (e.g. nitride, or metal oxide or other high K dielectric materials) in other embodiments.

After the formation layer 113, a control gate material layer 115 is deposited over layer 113. In one embodiment, layer 115 is of one or more control gate materials (e.g. polysilicon, metal).

Figure 2:
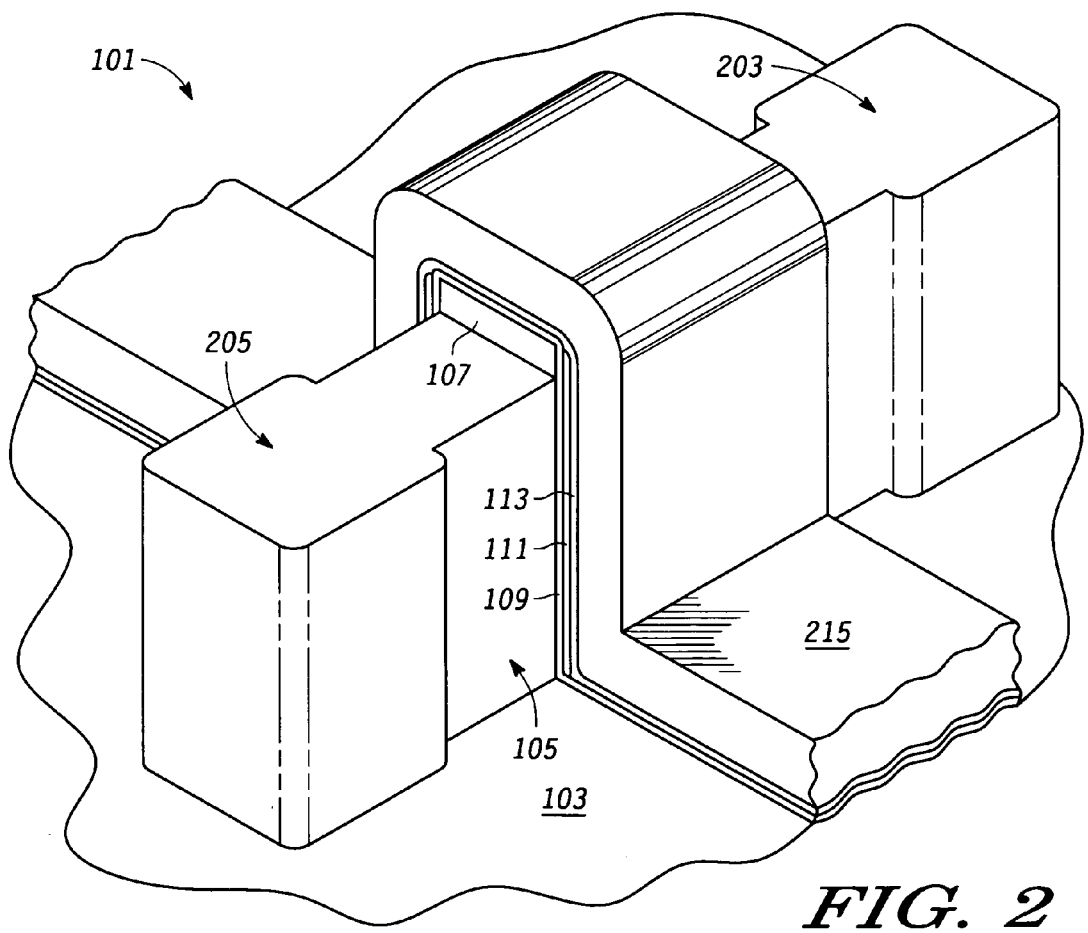
FIG. 2 is a partial perspective view of a wafer during a stage in its manufacture according to one embodiment of the present invention.

FIG. 2 is a partial perspective view of wafer 101 after control gate layer 115, layer 113, dielectric structures 111 and 112, and dielectric layer 109 have been patterned as per a gate structure pattern.

In one embodiment, the patterning is performed by depositing a layer of photo resist (not shown) on layer 115 (or on a planarized layer overlying layer 115), forming a pattern in the layer of photo resist by photolithographic techniques, removing portions of the photo resist as per the pattern to expose portions of layer 115, and then etching the exposed portions of layer 115 to form control gate structure 215 shown in FIG. 2. Layer 113, structures 111 and 112, and layer 109 are etched according to the pattern with anisotropic plasma etch chemistries that are selective with respect to a top masking layer. In one embodiment, layer 109 is not etched at this time.

Fin structure 105 is located between a two current electrode structures 205 and 203 which are formed from the same semiconductor layer as fin structure 105. In other embodiments structures 205 and 203 may have other shapes or configurations and may be connected to other fin structures of the same material. In some embodiments, multiple fin structures may be connected between structures 205 and 203 as in a multi-gate fin structure.

After the patterning of layers 115, 113, and 109 and structures 111 and 112, dopant may be implanted into wafer 101 to form source/drain regions (current electrode regions) in current electrode structures 204 and 205 and exposed portions of fin structure 105. These regions serve as the source and drain regions (or other types of current electrode regions for other types of transistors in other embodiments) for the multi-bit memory cell. Channel regions are located in fin structure 105 between the current electrode regions. In some embodiments, layer 109 is not patterned.

Figure 3:
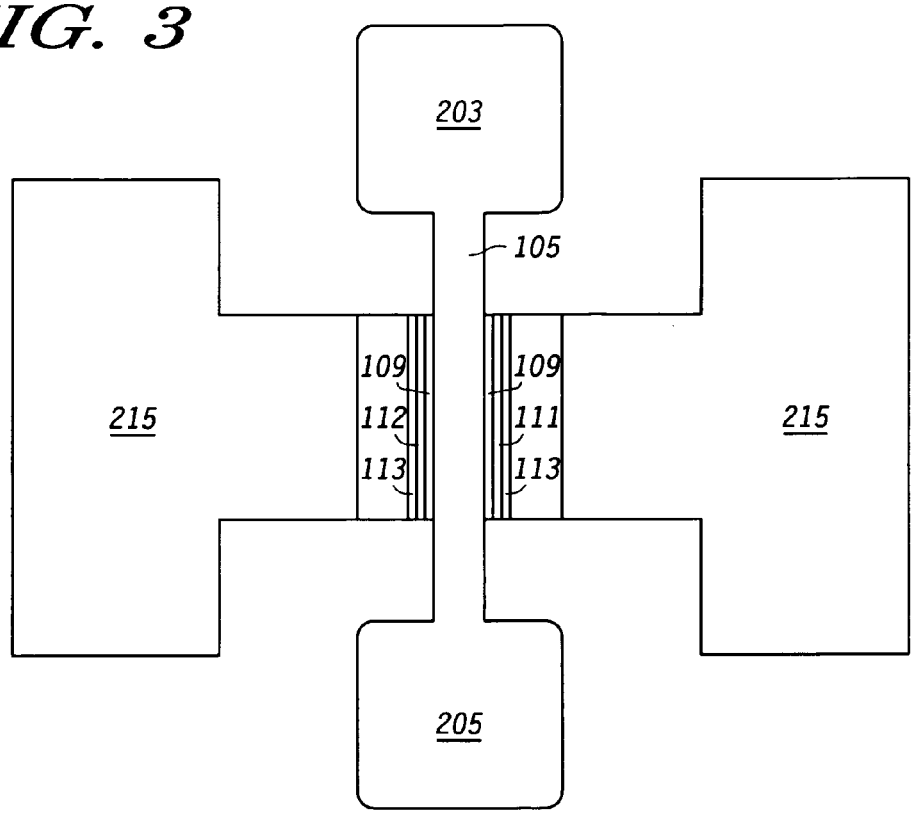
FIGS. 3-6 are partial cross sectional top views of a wafer during various stages in its manufacture according to one embodiment of the present invention.

FIG. 3 is a partial cutaway top view of wafer 101 from the view of FIG. 2. The cut away view is at a location roughly half way up the fin structure 105 and structures 203 and 205.

Also shown as partially cutaway in FIG. 3 are gate structure 215, layer 109, layer 113, and structures 111 and 112. Structure 111 is located adjacent to one sidewall of fin structure 105 between layer 109 and layer 113 and structure 112 is located adjacent to an opposite sidewall of fin structure 105 between layer 109, and layer 113. Structure 215, layer 109 and layer 113 include portions located over fin structure 105 but are not shown in FIG. 3 because of the cutaway view.

Figure 4:
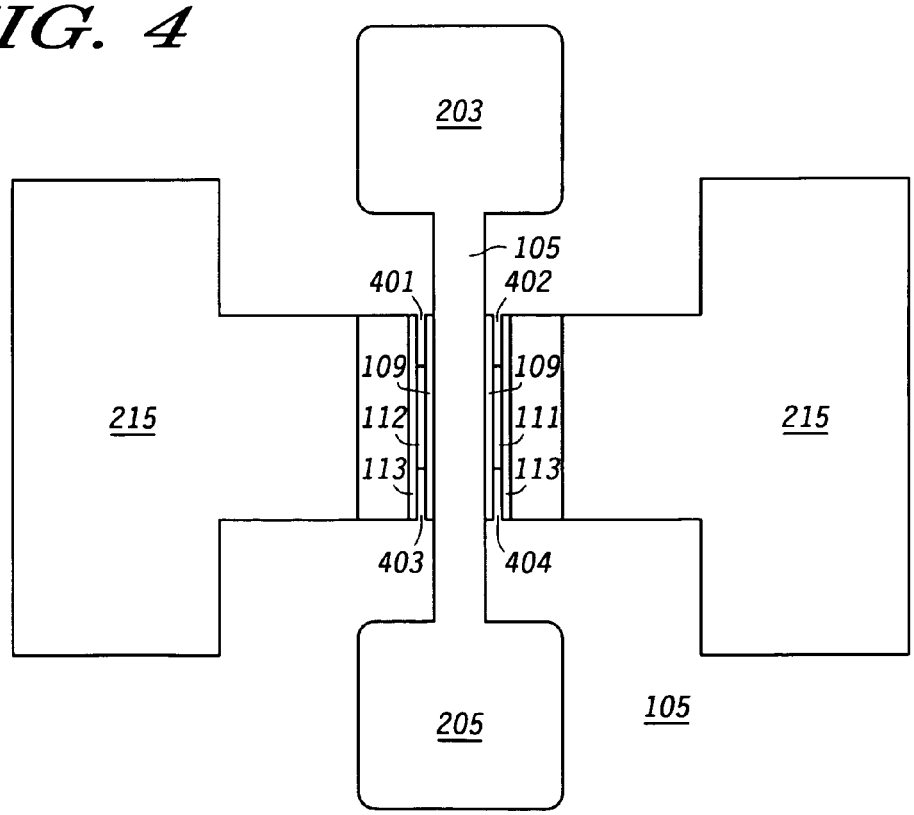

FIG. 4 is a partial cutaway top view of wafer 101 after wafer 101 has been subjected to an etch to remove edge portions of structures 112 to form openings 401 and 403 and to remove portions of structure 111 to form openings 402 and 404. The openings are formed along the sides of structures 111 and 112 that are exposed from the patterning of layer 115, layer 113, layer 109, and structures 111 and 112.

In one embodiment, openings 401-404 are etched by subjecting wafer 101 to an isotropic etch with an etchant that is selective to the material of structures 112 and 111 and selective with respect to the material of layers 109, 113, 115, cap 107, and fin structure 105. In one example where layers 109 and 113 is of silicon oxide, layer 115 is poly silicon, fin structure 105 is monocrystalline silicon, cap 107 is silicon dioxide, and structures 111 and 112 are of silicon nitride, wafer 101 is subject to an isotropic etch with hot phosphoric acid ($H_3PO_4$) for a predetermined period of time to remove a portion of structures 111 and 112. In embodiments where layers 109 and 113 are of a metal oxide, structures 111 and 112 are of silicon dioxide, and cap 107 is silicon nitride, wafer 101 is subject to an isotropic etch with HF acid for a predetermined period of time. In one embodiment, the amount of structures 111 and 112 removed is between 10 and 20 Angstroms. However, other amounts may be removed in other embodiments.

Figure 5:
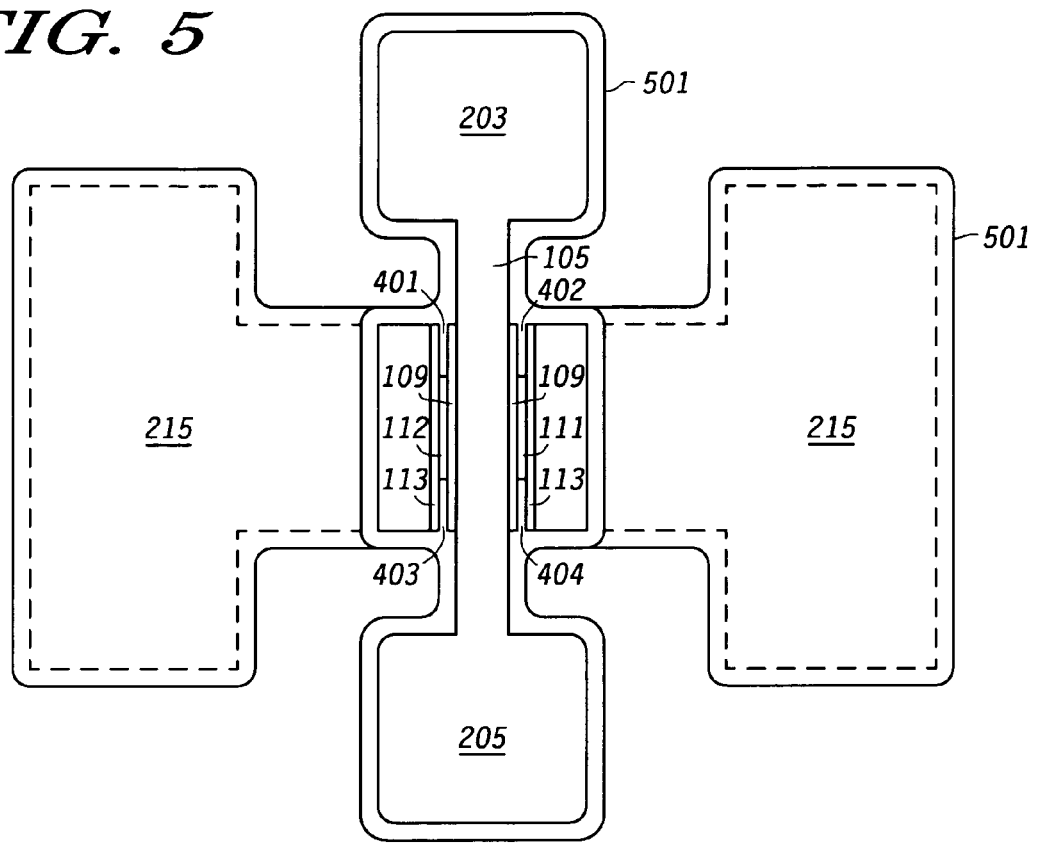

FIG. 5 is a partial cutaway top view of wafer 101 after a layer 501 of charge storage material has been deposited over wafer 101 including being deposited in openings 401-404. In one embodiment, layer 501 is made of silicon germanium and is deposited by a chemical vapor deposition (CVD) process, but may be made of other charge storage materials (e.g. germanium) and/or deposited by other processes. In one embodiment, layer 501 may be made of silicide formed from the co-sputtering of a metal (e.g. nickel, cobalt, titanium) and silicon in a plasma enhanced CVD process. In one embodiment, a silicide may be formed with sputtering of a metal silicide target. The material of layer 501 is preferably etch selective with respect to the material of fin structure 105 and the material of layer 115. In some embodiments, layer 501 may be doped in situ or may be doped subsequent to deposition.

In embodiments where the material of layer 501 is of a conductive material or semiconductor material (e.g. polysilicon, metal, silicon, poly silicon germanium, germanium, doped poly silicon, or doped poly silicon germanium) the resultant charge storage structures (e.g. 615-618 of FIG. 6) would be characterized as floating gates. The use of floating gate charge storage structures may provide for a more uniform charge distribution in the charge storage structure for storing a bit of information.

In one embodiment, layer 501 has a thickness in the range of 15-50 angstroms, but may have other thicknesses in other embodiments.

Figure 6:
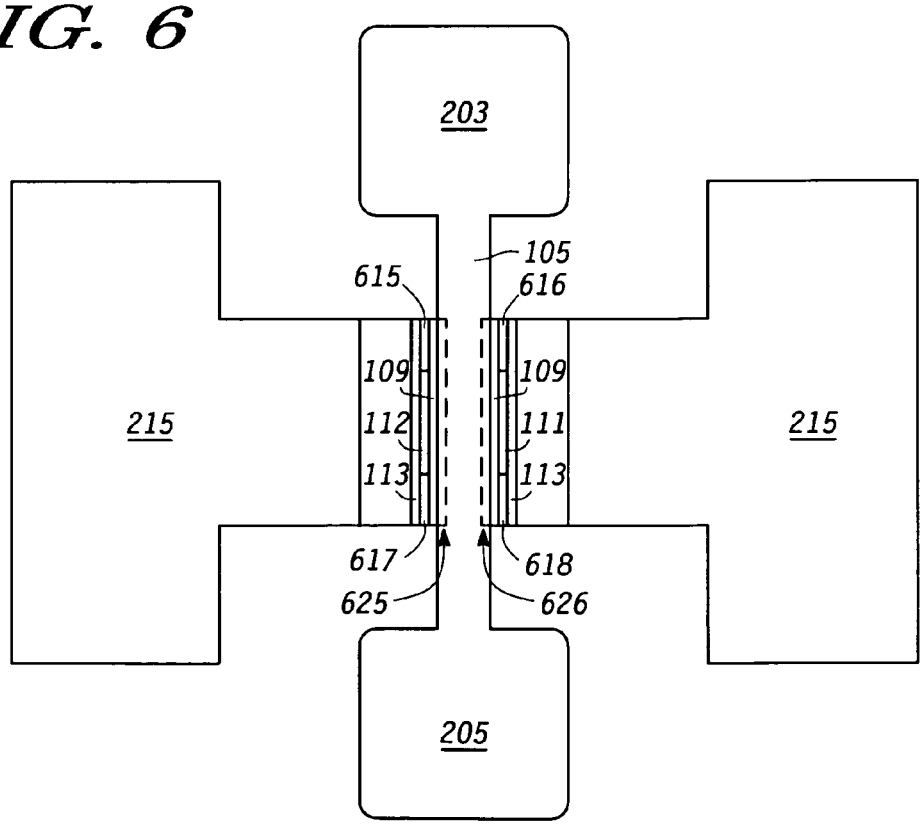

FIG. 6 is a partial cutaway top view of wafer 101 after the portion of layer 501 located external to openings 401-404 is removed with the material of layer 501 remaining in openings 401-404 as charge storage structures 615, 616, 617, and 618 respectively. In one embodiment, the external material of layer 501 is removed by subjecting wafer 101 to an etch for a predetermined of time.

In one embodiment, where layer 501 is of silicon germanium, wafer 101 is subjected to an isotropic etch of 40 ml of 70% $HNO_3$+20 ml of $H_2O_2$+5 ml of 0.5% HF for a predetermined period of time (e.g. 5 minutes) to remove the portion of layer 501 external to openings 401-404.

In other embodiments, external portions of layer 501 may be removed by etch processes including a dry plasma etch. External portions of layer 501 may be removed by an anisotropic etch or an etch having both a vertical and horizontal components (e.g. 70% vertical and 30% lateral). The greater the vertical component of the etch, the less reliant on a time to ensure that material of layer 501 remains in openings 401-404.

In an embodiment where layer 501 is made of silicide, the external portion of layer 501 may be removed by etching layer 501 with an HF acid.

In some embodiments, after the removing of material external to openings 401-404, a relatively short re-oxidation process (e.g. dry oxidation process) may be performed to removed any unremoved portions of layer 501 external to openings 401-405 and to encapsulate structures 615-618 with a dielectric (not shown).

At the stage in the embodiment shown in FIG. 6, the portions of structure 215 shown an opposite sides of the fin structure 105 are connected by control gate material located over fin structure 105. For this embodiment, a two bit memory cell is shown where one bit of information is selectively stored by selectively storing charge in charge storage structures 615 and 616, and a second bit of information is selectively stored by selectively storing charge in charge storage structures 617 and 618. In some embodiments, the material of structures 111 and 112 are located over fin structure 105. In such embodiments, a charge storage structure may be formed on top of the fin as well. With some of these embodiments, structures 617 and 618 may be continuously connected by the charge storage structure over the top of fin structure 105 structure.

Fin structure 105 includes a vertical channel region 625 located along one sidewall and a vertical channel region 626 located on an opposite sidewall of structure 105. Carrier transport in the channel region is in the general horizontal direction in the channel region between the current electrode region in structure 203 and fin structure 105 and the current electrode region in structure 205 and fin structure 105. As shown with the embodiment of FIG. 6, the current electrode regions, the charge storage structures 615, 616, 617, and 618 the channel regions, and the control gate structure 215 are all located in a horizontal plane.

In one embodiment, charge is stored in charge storage structures 615, 616, 617, and 618 by injecting electrons (or holes) into those structure e.g. by hot carrier injection procedures or by tunneling procedures. In one embodiment, charge is interjected in structures 615 and 616 by biasing the current electrode region in structure 203 as a drain at a high voltage, biasing control gate structure 215 at a voltage above the threshold voltage but below the drain voltage, and grounding the current electrode region in structure 205. Charge is stored in charge storage structures 617 and 618 in a similar manner except the high voltage is applied to the current electrode region in structure 205 and the current electrode region in structure 203 is grounded.

The bit stored in charge storage structures 615 and 616 is read by applying a read voltage to the current electrode region of structure 203, a read voltage above a voltage threshold to gate structure 215, and coupling the current electrode region of structure 205 to a sense amplifier. The bit stored in charge storage structures 617 and 618 is read in a similar manner except that the read voltage is applied to the current electrode region in structure 205 and the current electrode region of structure 203 is coupled to a sense amplifier.

The structure shown in FIG. 6 may be further processed to form a 4 bit memory cell by removing the portion of gate structure 215 over fin structure 105 to split gate structure 215 in two.

Figure 7:
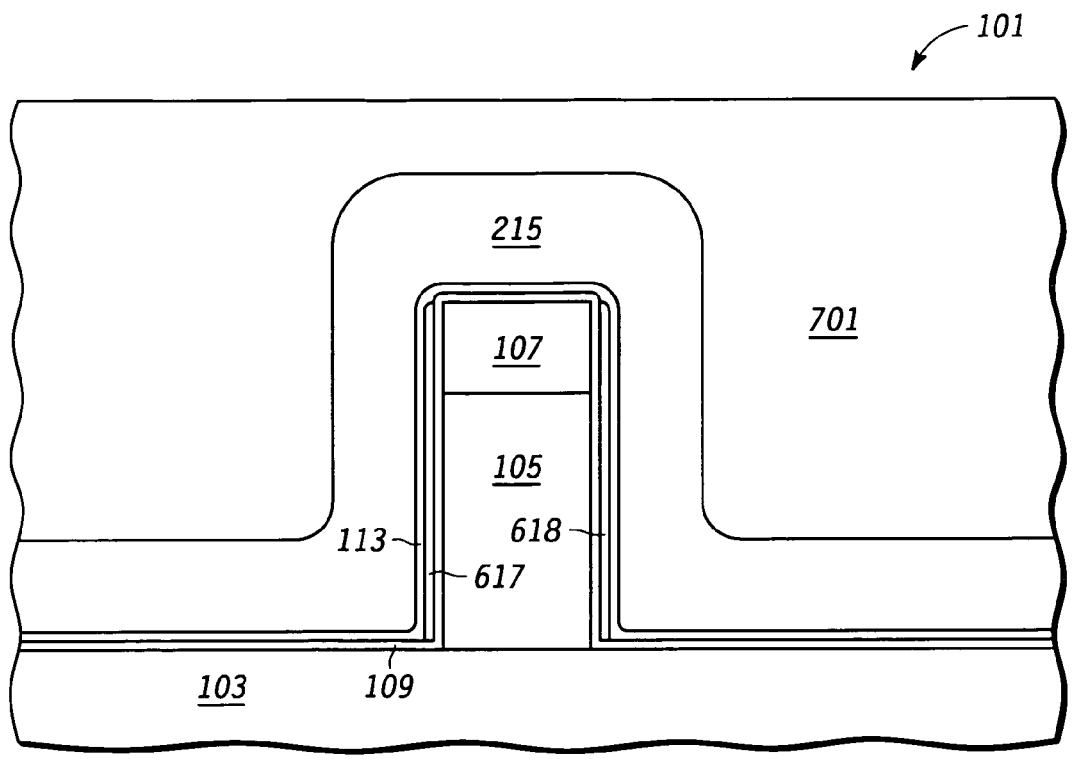
FIGS. 7-8 are partial cross sectional side views of a wafer during various stages in its manufacture according to one embodiment of the present invention.
Figure 8:
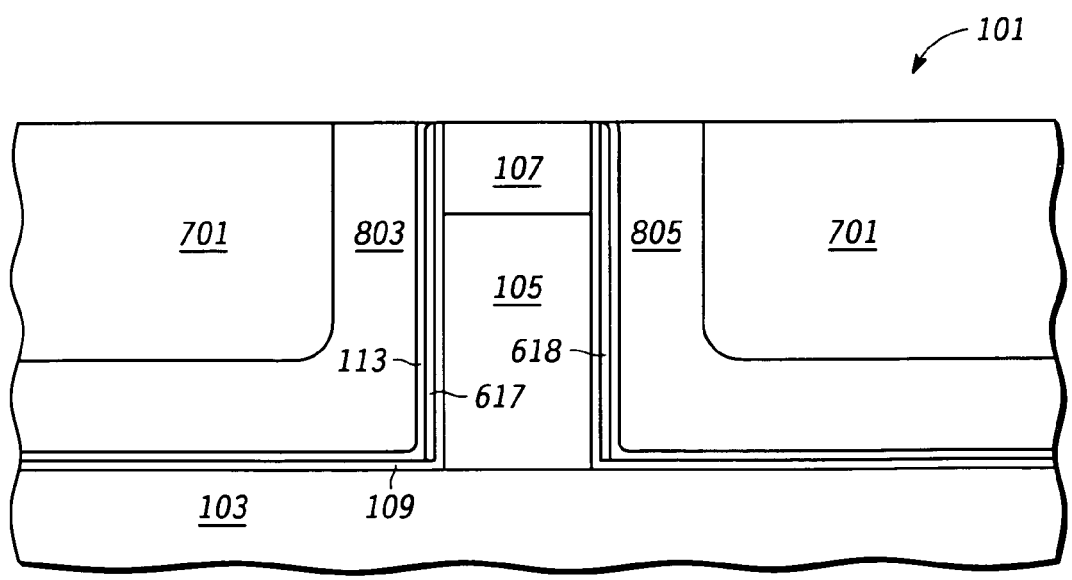

FIGS. 7-8 show partial side views of wafer 101 at different stages for removing the portion of gate structure 215 over fin structure 105 to separate gate structure 215 according to one embodiment.

Referring to FIG. 7, a layer 701 of dielectric material (e.g. TEOS) is deposited over wafer 101 to a height that is greater than cap 107. Wafer 101 is then subject to a chemical mechanical polish process (CMP) using the material of cap 107 as a planarizing stop to remove the material of gate structure 215 over fin structure 105 to form gate structures 803 and 805 (see FIG. 8). With such embodiments, the material of cap 107 would be detectable in a CMP of the material of layer 701. In some embodiments, wafer 101 is planarizing for a predetermined period of time subsequent to the detection of the material from cap 107 to remove some of cap 107 to ensure the isolation of control gate structures 803 and 805. In some embodiments, cap 107 may include an additional top layer of a material that is detectable in a CMP of the material of layer 701.

Referring back to FIG. 6, with gate structure 215 being physically and electrically separated into gate structure 803 and gate structure 805 (as shown in FIG. 8), each of charge storage structures 615, 616, 617, and 618 is individually programmable and readable to provide the resultant device shown in FIG. 6 with the ability to store 4 bits of information.

Storing charge and reading a charge storage structure (615-618) of a four bit cell is similar to that of the two bit cell described above except that the control gate structure (e.g. 803 and 805) on the side of the charge storage structure to be programmed or read is biased at the program voltage or the read voltage and the control gate structure on the opposite side of fin structure 105 is grounded (or has a relatively lower voltage applied to it).

For example, to read charge storage structure 615, a read voltage is applied to the current electrode region in structure 203, a read voltage to gate structure 803 (which would be the portion of structure 215 shown on the left side of fin structure 105 in the view of FIG. 6), and the current electrode region of structure 205 is coupled to a sense amplifier. During this read, gate structure 805 (the portion of gate structure 215 located to the right of fin structure 105 in FIG. 6) is grounded. For reads and programming of charge storage structures 616 and 618, gate structure 803 would be grounded (or have a relatively lower voltage applied to it).

The portion of gate structure 215 over fin structure 105 may be removed to form separate gate structures by other processes in other embodiments. In one embodiment, a planar layer (not shown) may be formed over wafer 101 by a spin on or chemical vapor deposition technique to a level that exposes the top of structure 215 but covers other portions of gate structure 215. The planar layer may be of photo resist, spin on glass, or organic antireflective coating material. The layer may be formed to a level higher than the top of structure 215 and then subsequently etched back by conventional dry or wet etch techniques to expose the top of structure 215. The planar layer may be reflowed or subjected to a CMP process after initial formation.

The exposed portion of structure 215 over fin structure 105 is then removed by a non abrasive etching (e.g. wet or dry) to form independent gate structures. In some embodiments a thin nitride layer may be formed over layer 115 to protect layer 115 during the formation of the planar layer.

Wafer 101 may be subject to subsequent processes after the stage in FIG. 8 (for a 4 bit cell) or the stage in FIG. 6 (for a two bit cell). For example, contacts may be formed to gate structures (803 and 805) and to the current electrode structures (203 and 205). Interconnect layers including interconnects and interlayer dielectrics may be formed over wafer 101. Bonding pads and passivation layers may be formed over the interconnect layers. The wafer maybe singulated into individual integrated circuit die and packaged into integrated circuit packages. Although only one multi-bit memory cell is shown in the Figures, it is understood, that wafer 101 includes a plurality of such devices as well as other logic circuitry (not shown).

Referring back to FIG. 5, the removal of material of layer 501 external to openings 401-404 may be performed by other processes in other embodiments.

Figure 9:
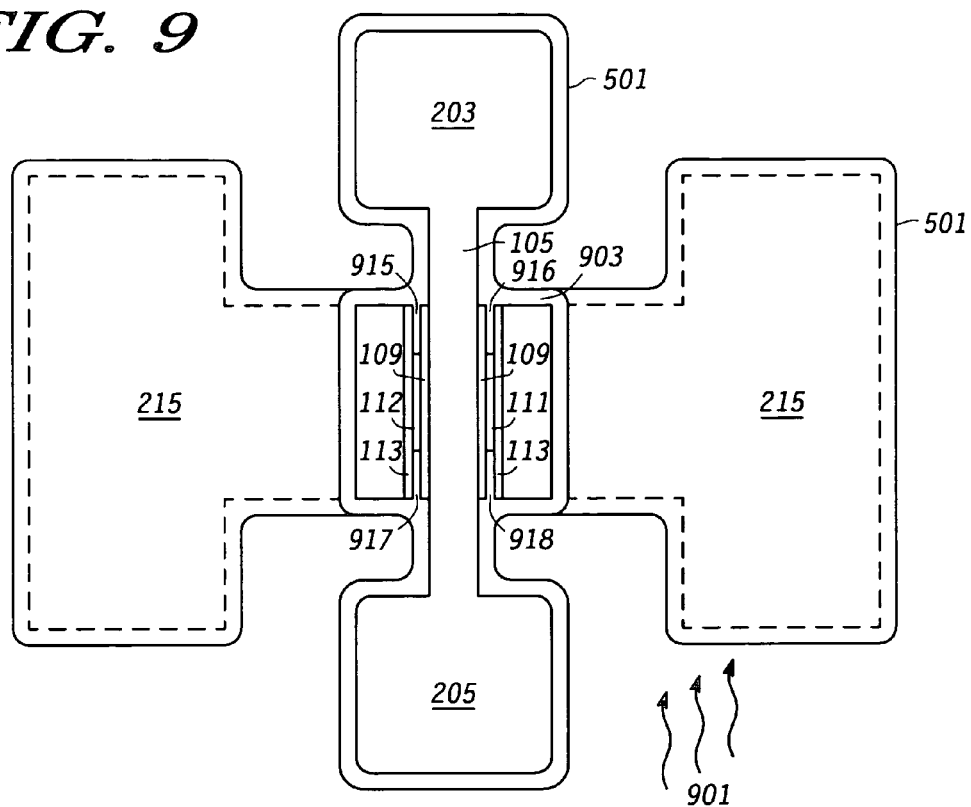
FIGS. 9-11 are partial cross sectional side views of a wafer during various stages in its manufacture according to another embodiments of the present invention.

FIG. 9 shows a partial top view of wafer 101 where ions 901 are being implanted into the material of layer 501 at locations external to openings 401-404 to make the material of layer 501 external to the openings etch selective with the material of layer 501 in openings 401-404. In one embodiment, layer 501 is implanted with an amorphizing dopant (Xenon, Argon, or Germanium) to amorphize those portions wherein the portions (charge storage structures 915, 916, 917, and 918) of layer 501 in openings 401-404 would not be amorphized. In one embodiment, the amorphizing species would be implanted at a dose of 1×10E15 to 5×10E15 ions per square centimeter and at an energy of 1 kV to 15 kV. However, the ions may be implanted at other energies in other embodiments. Also, the ions would be implanted at a slanted angle between 10 and 45 degrees at various directions to enable the ions to be implanted into the material located adjacent to sidewalls.

The amorphized material of layer 501 would be removed by an HF etch which is selective with respect to the unamorphized portions to leave charge storage structures 915, 916, 917, and 918.

In another embodiment, ions of arsenic, antimony, indium, fluorine, or $BF_2$ may be implanted into the regions of layer 501 external to openings 401-404 to dope those regions so as to make them selectively removable with respect to the undoped regions (charge storage structures 915, 916, 917, and 918) of openings 401404. In one embodiment, these ions maybe implanted at a dosage of 10E14 to 10E15 ions per square centimeter and at energies of 500 eV (for Fluorine) to 30 keV (for indium). However, other dosages and/or other energies may be utilized in different embodiments.

The doped regions would be removed by subjecting wafer 101 to an etch (e.g. of $CF_4$, $NF_3$, $CL_2$, or HBr). The etch rates of the doped regions would be significantly faster than that for the undoped regions (e.g. up to 500 times faster for doping levels of $5 \times 10E18$ $cm^{-3}$ and above).

Figure 10:
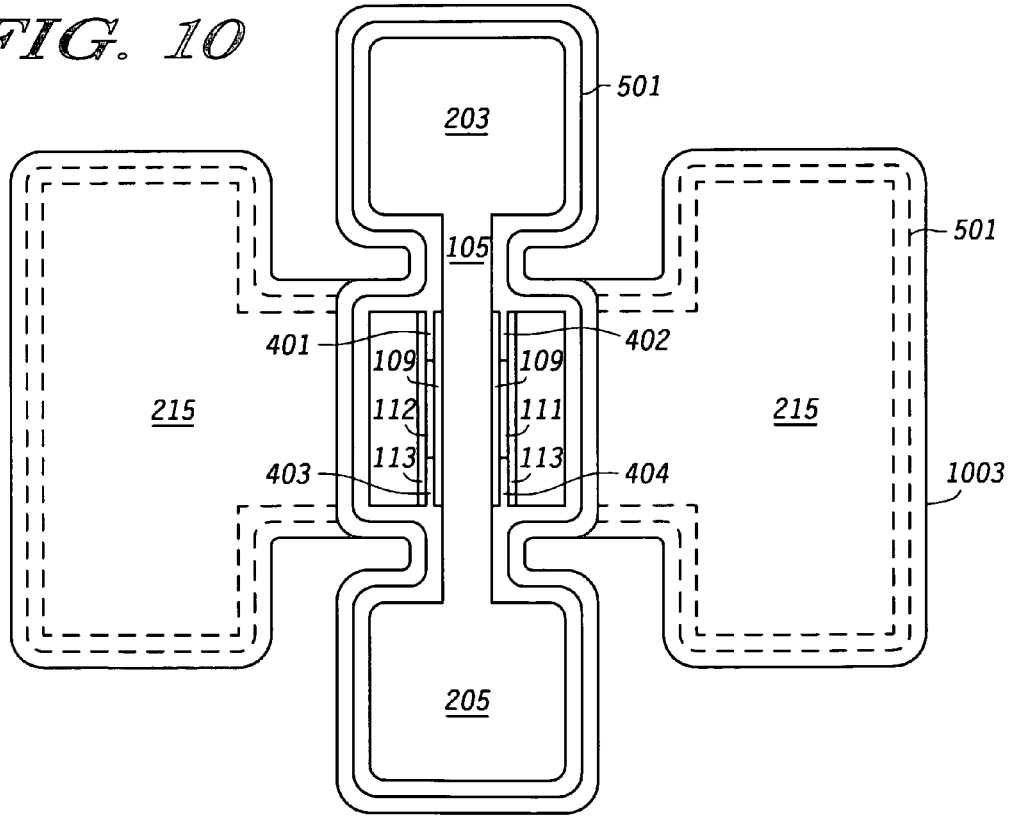
Figure 11:
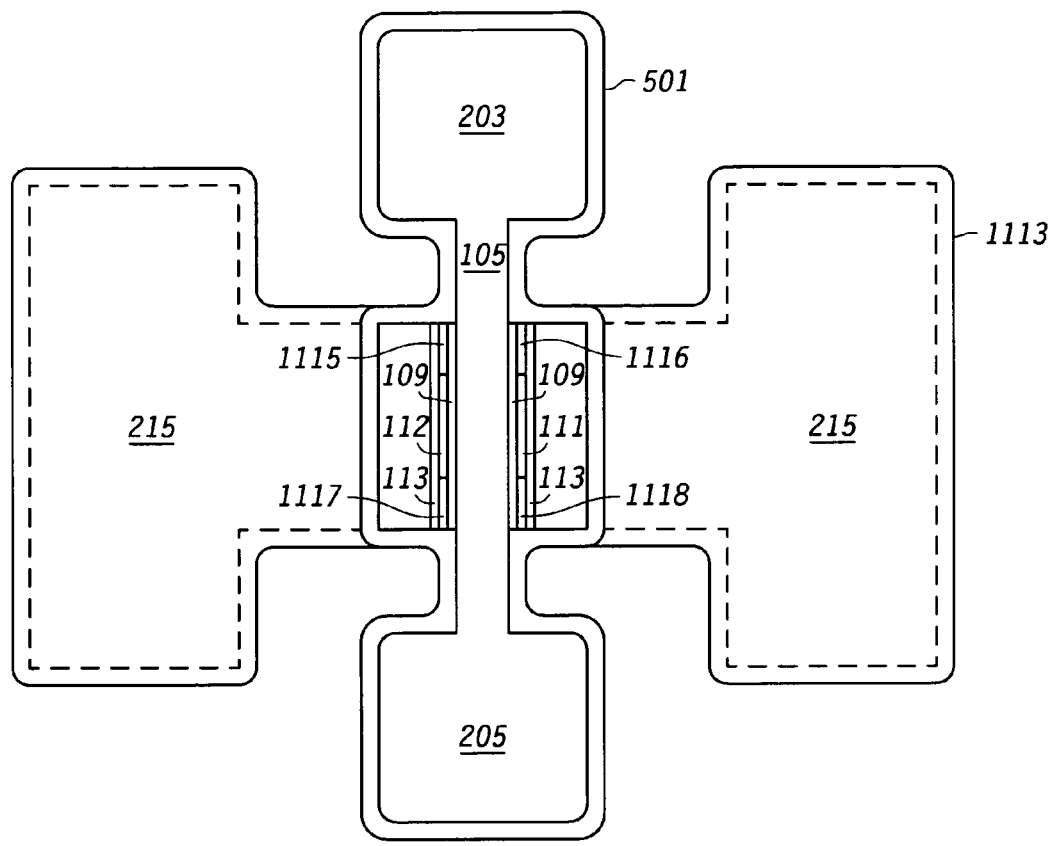

Referring to FIGS. 10 and 11, the material of layer 501 external to openings 401-404 may be removed by a silicidation process. Referring to FIG. 10, a metal layer 1003 (e.g. nickel, cobalt, titanium, palladium, and platinum) is deposited over layer 501. Wafer 101 is then heated (e.g. at 250-500 C) wherein the metal layer 1003 reacts with the silicon of layer 501 to form silicide 1113 (see FIG. 11). The portions (1115-1118, see FIG. 11) of layer 501 in openings 401-404 are not silicided. Any unreacted metal would be removed. Afterwards the silicide 1113 is then removed by an HF etch (or other etchant) that is selective to the silicide and selective with respect to the unsilicided material of layer 501. The removal of the silicide leaves charge storage structures 1115, 1116, 1117, and 1118.

Providing a multi-bit memory cell with electrically isolated charge storage structures may advantageously inhibit charge from migrating between the charge storage structures of the multi-bit cell, thereby providing for a more reliable non volatile memory device having multi-bit memory cells. Furthermore, providing electrically isolated charge storage structures in transistor with a vertical channel region further allows for a greater bit density of a non-volatile memory while inhibiting charge migration between the charge storage structures.

Although a multi-bit memory cell is shown with a single fin structure (fin structure 105), a multi-bit memory cell (e.g. a two bit memory cell) may be implemented with multiple fin structures (e.g. between structures 205 and 203). Also, multi-bit cells may be implemented with NMOS transistors or PMOS transistors, or be implemented with other types of transistors in other embodiments. Furthermore, the formation of the charge storage structures as set forth above may be performed for other types of transistors having vertical channel regions located along sidewalls of a semiconductor structure e.g. such as transistors having channel regions along the sidewalls of mesa semiconductor structures and along sidewalls of trenches.

In one embodiment, a semiconductor device includes a semiconductor structure having a first sidewall and a channel region located in the semiconductor structure. The channel region includes a portion located along the first sidewall. The channel region is located between a first current electrode region and a second current electrode regions. The semiconductor device includes a first charge storage structure and a second charge storage structure formed adjacent to the first sidewall and adjacent to the portion of the channel region located along the first sidewall. The first charge storage structure and the second charge storage structure are electrically isolated from each other and from the semiconductor structure. The semiconductor device includes a control electrode formed adjacent to the first sidewall.

In another embodiment, a method for forming a semiconductor device includes forming a semiconductor structure. The semiconductor structure has a first sidewall. The semiconductor structure includes a channel region including a portion located along the first sidewall. The method includes forming a first dielectric layer adjacent to the first sidewall of the semiconductor structure and including adjacent to the portion of the channel region located along the first sidewall. The method includes forming a second dielectric layer adjacent to the first dielectric layer, forming a third dielectric layer adjacent to the second dielectric layer, and forming a control electrode adjacent to the third dielectric layer. The method includes removing a first portion of the second dielectric layer to form a first opening between the first dielectric layer and the third dielectric layer and removing a second portion of the second dielectric layer to form a second opening between the first dielectric layer and the third dielectric layer and forming a first charge storage structure and a second charge storage structure. The forming the first charge storage structure includes forming charge storage material in the first opening and the forming the second charge storage structure includes charge storage material in the second opening:

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A semiconductor device, comprising:
   a semiconductor structure having a first sidewall and a channel region, wherein a portion of said channel region is disposed along said first sidewall, and wherein the channel region is disposed between first and second current electrode regions;
   first and second charge storage structures disposed adjacent to the first sidewall and adjacent to the portion of the channel region disposed along the first sidewall, wherein the first and second charge storage structures are electrically isolated from each other and from the semiconductor structure;
   a first control electrode formed adjacent to the first sidewall;
   a first dielectric layer disposed between the control electrode and the first sidewall;
   a second dielectric layer disposed between the control electrode and the first dielectric layer; and
   a third dielectric layer disposed between the first dielectric layer and the second dielectric layer;
   wherein a portion of the third dielectric layer is laterally disposed between the first charge storage structure and the second charge storage structure; wherein the first dielectric layer has a first lateral length $L_1$ in a first direction along the first sidewall, the second dielectric layer has a second lateral length $L_2$ in a direction parallel to the first direction, and the third dielectric layer has a third lateral length $L_3$ in a direction parallel to the first direction; and wherein $L_3 < L_1, L_2$.

2. The semiconductor device of claim 1, wherein the semiconductor device further comprises:
   third and fourth charge storage structures located adjacent to a second sidewall of said semiconductor structure, wherein the third and fourth charge storage structures are electrically isolated from each other and are electrically isolated from the semiconductor structure.

3. The semiconductor device of claim 2, further comprising a second control electrode disposed adjacent to the second sidewall, wherein the second control electrode is electrically independent from the first control electrode.

4. The semiconductor device of claim 2, wherein said first and second sidewalls form opposing surfaces of the semiconductor device.

5. The semiconductor device of claim 1, wherein each of the first and second charge storage structures comprises germanium.

6. The semiconductor device of claim 1, further comprising:
   a first dielectric layer formed adjacent to the first sidewall;
   a second dielectric layer formed adjacent to the first dielectric layer; and a third dielectric layer formed adjacent to the second dielectric layer;

wherein the first, second, and third dielectric layers provide electrical isolation for the first charge storage structure and the second charge storage structure;

wherein the second dielectric layer has first and second openings therein, and wherein the first charge storage structure is formed within the first opening and the second charge storage structure is formed within the second opening.

7. The semiconductor device of claim 6, wherein the first and second dielectric layers respectively comprise first and second distinct materials.

8. The semiconductor device of claim 1, wherein the first and second charge storage structures are floating gate charge storage structures.

9. The semiconductor device of claim 8, wherein said semiconductor device is a non-volatile memory cell.

10. The semiconductor device of claim 1, wherein the semiconductor structure is a semiconductor fin structure.

11. The semiconductor device of claim 10, wherein the fin structure is capped with a fourth dielectric layer.

12. The semiconductor device of claim 1, wherein the first and second charge storage structures comprise a material selected from the group consisting of polysilicon, metal, silicon, germanium, and polysilicon germanium.

13. The semiconductor device of claim 12, wherein the first and second charge storage structures comprise a metal.

14. The semiconductor device of claim 12, wherein the first and second charge storage structures comprise polysilicon.

15. The semiconductor device of claim 12, wherein the first and second charge storage structures comprise polysilicon germanium.

16. The semiconductor device of claim 1, wherein the first and second charge storage structures are formed within a layer having a thickness within the range of 20 Å to 70 Å.

17. The semiconductor device of claim 1, wherein the first dielectric layer has a thickness within the range of 10 Å to 100 Å.

18. The semiconductor device of claim 1, wherein the third dielectric layer comprises a high-k material.

19. The semiconductor device of claim 1, wherein the fourth dielectric layer comprises silicon nitride.

20. The semiconductor device of claim 1, wherein said semiconductor structure is disposed on a dielectric substrate.

21. A semiconductor device, comprising:

a semiconductor structure formed on an SOI wafer and having a first sidewall and a channel region, wherein the channel region is disposed between a first current electrode region and a second current electrode region, and wherein a portion of the channel region is disposed along the first sidewall;

first and second charge storage structures, wherein the first charge storage structure is disposed adjacent to the first sidewall and adjacent to the portion of the channel region located along the first sidewall, and wherein the first charge storage structure and the second charge storage structure comprise electrically conductive materials having thicknesses within the range of about 15 Å to about 50 Å and which are electrically isolated from each other and from the semiconductor structure; and a control electrode formed adjacent to the first sidewall.

22. The semiconductor device of claim 21, wherein each of the first and second charge storage structures comprises a charge carrier disposed in an electrically conductive medium.

23. The semiconductor device of claim 22, wherein the electrically conductive medium comprises a material selected from the group consisting of polysilicon and metal.

24. The semiconductor device of claim 21, wherein each of the first and second charge storage structures is a floating gate.

* * * * *